US010361523B2

(12) United States Patent
Chuang et al.

(10) Patent No.: US 10,361,523 B2
(45) Date of Patent: Jul. 23, 2019

(54) USB CONNECTING APPARATUS

(71) Applicants: NICECONN TECHNOLOGY CO., LTD., New Taipei (TW); Yi-Fang Chuang, New Taipei (TW); Nai-Chien Chang, New Taipei (TW)

(72) Inventors: Yi-Fang Chuang, New Taipei (TW); Nai-Chien Chang, New Taipei (TW)

(73) Assignees: NICECONN TECHNOLOGY CO., LTD., New Taipei (TW); Yi-Fang Chuang, New Taipei (TW); Nai-Chien Chang, New Taipei (TW)

(*) Notice: Subject to any disclaimer, the term of this patent is extended or adjusted under 35 U.S.C. 154(b) by 0 days.

(21) Appl. No.: 15/800,161

(22) Filed: Nov. 1, 2017

(65) Prior Publication Data
US 2018/0138646 A1 May 17, 2018

(30) Foreign Application Priority Data

Nov. 14, 2016 (TW) .............................. 105217336 U

(51) Int. Cl.
| H01R 13/648 | (2006.01) |
| H01R 24/60 | (2011.01) |
| H01R 13/66 | (2006.01) |
| H01R 12/52 | (2011.01) |
| H01R 13/6594 | (2011.01) |
| H05K 1/11 | (2006.01) |
| H01R 107/00 | (2006.01) |

(Continued)

(52) U.S. Cl.
CPC .............. *H01R 24/60* (2013.01); *H01R 12/52* (2013.01); *H01R 13/6594* (2013.01);
(Continued)

(58) Field of Classification Search
CPC ... H01R 24/60; H01R 13/665; H01R 2107/00
(Continued)

(56) References Cited

U.S. PATENT DOCUMENTS

| 7,988,495 B2* | 8/2011 | Chung ................. H01R 12/724 |
| | | 439/607.35 |
| 9,954,318 B2* | 4/2018 | Lee ........................ H01R 27/02 |

(Continued)

FOREIGN PATENT DOCUMENTS

| CN | 202121130 U | 1/2012 |
| CN | 105098436 A | 11/2015 |

(Continued)

OTHER PUBLICATIONS

Evaluation Report dated Aug. 17, 2017 of the correspond China Utility Model Patent.

*Primary Examiner* — Abdullah A Riyami
*Assistant Examiner* — Nelson R. Burgos-Guntin
(74) *Attorney, Agent, or Firm* — Chun-Ming Shih; HDLS IPR Services

(57) ABSTRACT

A USB connecting apparatus includes a board member, a plurality of first conductive connection portions, a metal housing and an assembly structure. The board member is a printed circuit board complying with the USB-Type C specification and includes a main body portion and a tongue portion. The tongue portion includes two surfaces facing toward each other. Each first conductive connection portion is electrically disposed on at least one surface of the tongue portion in order to form a tongue plate. The metal housing is arranged on the board member and surrounds the tongue plate correspondingly. The assembly structure is arranged on the plate member and/or the metal housing. The plate member and the metal housing are positioned relative to each other via the assembly structure. Accordingly, the USB connecting apparatus can be used on an existing electronic product circuit board and can be directly used as USB Type-C.

15 Claims, 11 Drawing Sheets

(51) Int. Cl.
  *H01R 24/64*  (2011.01)
  *H05K 1/14*   (2006.01)
  *H05K 3/36*   (2006.01)

(52) U.S. Cl.
  CPC ........... *H01R 13/665* (2013.01); *H05K 1/117* (2013.01); *H01R 24/64* (2013.01); *H01R 2107/00* (2013.01); *H05K 1/141* (2013.01); *H05K 3/368* (2013.01); *H05K 2201/042* (2013.01); *H05K 2201/09036* (2013.01); *H05K 2201/10189* (2013.01); *H05K 2201/10303* (2013.01)

(58) Field of Classification Search
  USPC ...... 439/55, 83, 660, 108, 855, 607.01, 637, 439/607.4, 607.36, 607.35, 677, 607.05
  See application file for complete search history.

(56) References Cited

U.S. PATENT DOCUMENTS

| | | | |
|---|---|---|---|
| 2017/0040730 A1* | 2/2017 | Yu | H01R 13/405 |
| 2017/0070007 A1* | 3/2017 | Lee | H01R 27/02 |
| 2017/0179634 A1* | 6/2017 | Du | H01R 13/521 |
| 2017/0179658 A1* | 6/2017 | Chuang | H01R 24/60 |
| 2017/0222353 A1* | 8/2017 | Zhang | H01R 13/504 |
| 2017/0279226 A1* | 9/2017 | Tsai | H01R 13/6581 |
| 2018/0131111 A1* | 5/2018 | Tzviskos | H01R 13/516 |
| 2018/0138646 A1* | 5/2018 | Chuang | H01R 24/60 |

FOREIGN PATENT DOCUMENTS

| | | |
|---|---|---|
| CN | 205335569 U | 6/2016 |
| CN | 205692997 U | 11/2016 |
| CN | 205693026 U | 11/2016 |

\* cited by examiner

US 10,361,523 B2

USB CONNECTING APPARATUS

BACKGROUND OF THE INVENTION

Field of the Invention

The technical field relates to a USB connecting apparatus, in particular, to a USB connecting apparatus capable of allowing an existing electronic product circuit board to have the USB Type-C available for use.

Description of Related Art

With regard to the USB Type-C connector developed in recent years, due to its high applicability and acceptance for both positive and reverse insertions, it has been a standard for various types of electronic products nowadays.

However, since a lot of electronic products are still in the intermediate stage such introduction of new technology, and a lot of such electronic products are still considered relatively new in the market but are only lack of the latest USB Type-C connector built therein, the redesign of electronic product circuits equipped with USB Type-C connectors can be costly for such existing electronic products, which is an issue troubles a great number of manufacturers in the industry.

Accordingly, the inventor seeks to overcome aforementioned drawback, and after years of researches along with the utilization of scientific principles, the inventor provides a novel design of the present invention capable of allowing an existing electronic product circuit board to have the USB Type-C function available for uses.

SUMMARY OF THE INVENTION

An objective of the present invention is to provide a USB connecting apparatus applicable to an existing electronic product circuit board and capable of being used for USB Type-C directly.

To achieve the aforementioned objective, the present invention provides an USB connecting apparatus, comprising: a board member configured to be a printed circuit board complying with a USB-Type C specification and comprising a main body portion and a tongue portion; the tongue portion having two surfaces facing toward each other; a plurality of first conductive connection portions electrically disposed on at least one surface of the tongue portion in order to for a tongue plate; a metal housing arranged on the board member and surrounding the tongue plate correspondingly; and an assembly structure arranged on the plate member and/or the metal housing; the plate member and the metal housing configured to positioned relative to each other via the assembly structure.

In comparison to prior arts, the present invention includes the following technical effects: the USB connecting apparatus of the present invention can be used on an existing electronic product circuit board and can be used as USB Type-C directly such that it is of simple design and convenient to use; in addition, a significant amount of cost for redesign of circuit boards can be saved accordingly.

DETAILED DESCRIPTION OF THE INVENTION

The following provides a detailed description on the technical content of the present invention along with the accompanied drawings. However, it shall be understood that the accompanied drawings are provided for reference and illustration purposes only, which shall not be used to limit the scope of the present invention.

Figure 7:
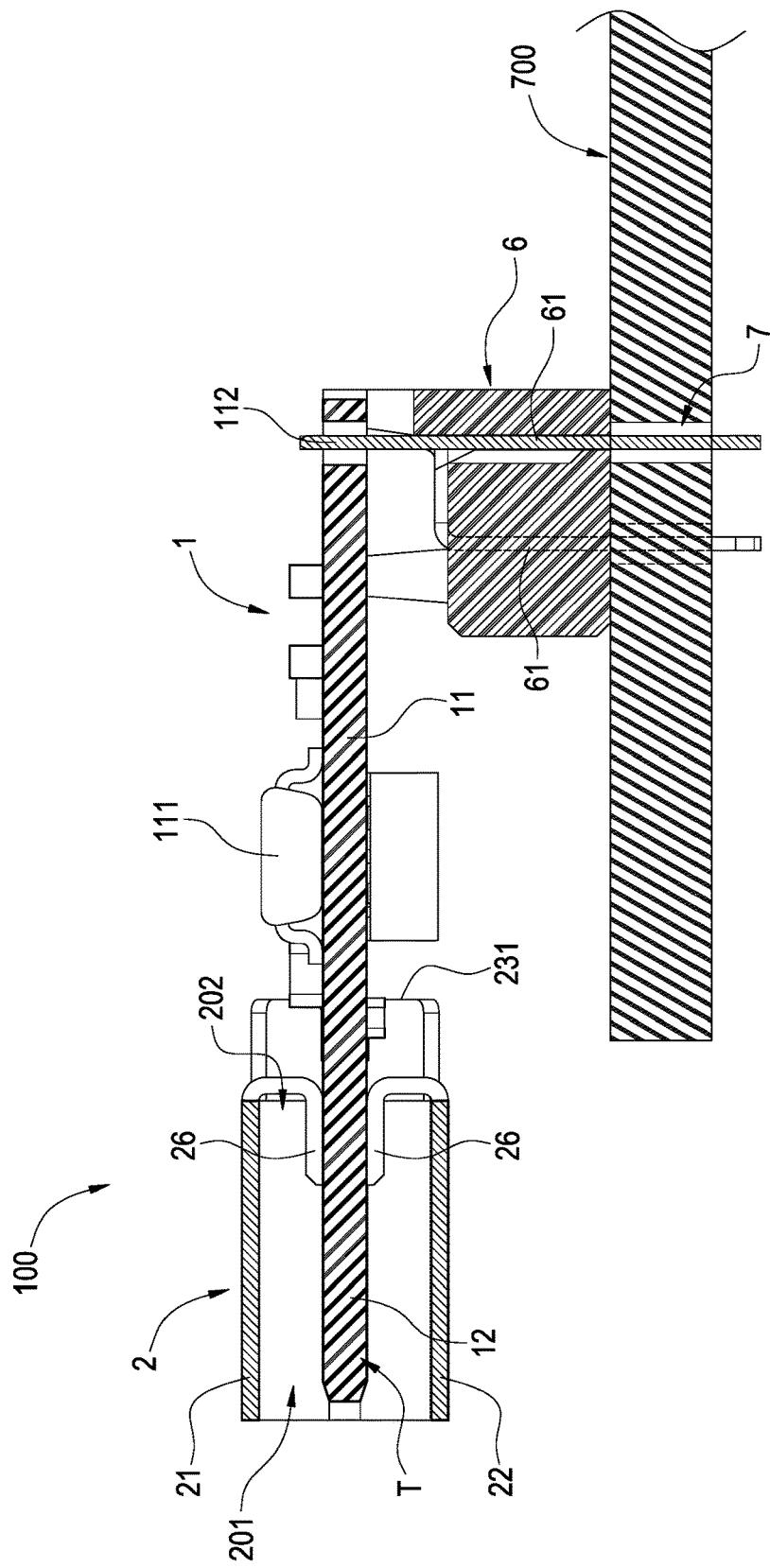
FIG. 7 is a cross sectional view of a USB connecting apparatus of the present invention according to FIG. 6 electrically connected to an electronic product.

The present invention provides a USB connecting apparatus. As shown in FIG. 7, it is mainly used to allow an existing electronic product circuit board 700 without the built-in USB Type-C electrical connection portion to be used as USB Type-C directly by electrically connecting the USB connecting apparatus 100 of the present invention to the electrical connection portion 7 of the electronic product circuit board 700 without any modifications of the existing electronic circuit board.

As shown in FIG. 1 to FIG. 5, the USB connecting apparatus 100 of the present invention comprises: a board member 1, a plurality of first conductive connection portions 121, a metal housing 2 and an assembly structure 3, and preferably, it further comprises a plurality of second conductive connection portions 112.

The board member 1 is configured to be a printed circuit board (can be a rigid printed circuit board or a flexible printed circuit board) complying with the USB Type-C specification. The board member 1 includes a main body portion 11 and a tongue portion 12 integrally extended from a front side edge 1101 of the main body portion 11. The tongue portion 12 includes two surfaces facing toward each other. The board member 1, preferably, can be further electrically connected with at least one electronic unit 111 on its main body portion 11 via the welding method. In this exemplary embodiment, the electrical configuration includes, such as: the electronic unit 111 of conversion IC, protection IC, surge protection IC, inductor, resistor or various types of feasible IC etc., and the present invention is not limited to such types only.

Each one of the first conductive connection portions 121 is electrically disposed on at least one surface (in this exemplary embodiment, it is electrically disposed on two surfaces of the tongue portion 12) of the tongue portion 12 and is electrically connected to the circuit (not shown in the drawings) on the main body portion 11; therefore, it forms a tongue plate T complying with the USB Type-C specification and belonging to the female connector, and the tongue plate T also includes two surfaces facing toward each other. To be more specific, each one of the first conductive connection portions 121 is a gold finger formed on the tongue portion 12, and the gold fingers are arranged spaced apart from each other in parallel, which are arranged corresponding to the upper row of conductive terminals and/or lower row of conductive terminals of a USB-Type C male connector (not shown in the drawings) in order to be inserted onto each other to form electrical connections. In addition, the quantity of the first conductive connection portions 121 is 24 units at most, such as complying with the 4-24 units for the USB Type-C specification; however, the present invention is not limited to such quantity only. For example, a portion of the first conductive connection portions 121 originally used for transmitting electrical power can be omitted, or a portion of the first conductive connection portions 121 originally used for transmitting signals can be omitted, or any portion of conductive connection portions 121 permitted to be omitted can be omitted; regardless of the method of omission adopted, the remaining first conductive connection portions 121 shall still comply with the USB Type-C specification.

The plurality of second conductive connection portions 112 are electrically disposed at the area adjacent to the rear side of the of the main body portion 11 and are electrically connected to the circuits (not shown in the drawings) on the main body portion 11 in order to allow the first conductive connection portions 121 to be electrically connected to the plurality of second conductive connection portions 112.

The metal housing 2 is arranged on the board member 1 and surrounds (or encloses) the tongue plate T correspondingly such that a complete USB Type-C female connector (not labeled with the component sign) can be assembled completely. The metal housing 2 includes a top surface 21 and a bottom surface 22 facing toward each other as well as two lateral sides 23 facing toward each other. The front and rear sides of the metal housing 2 are formed of an insertion port 201 and an opening 202 thereon respectively and facing toward each other.

Figure 1:
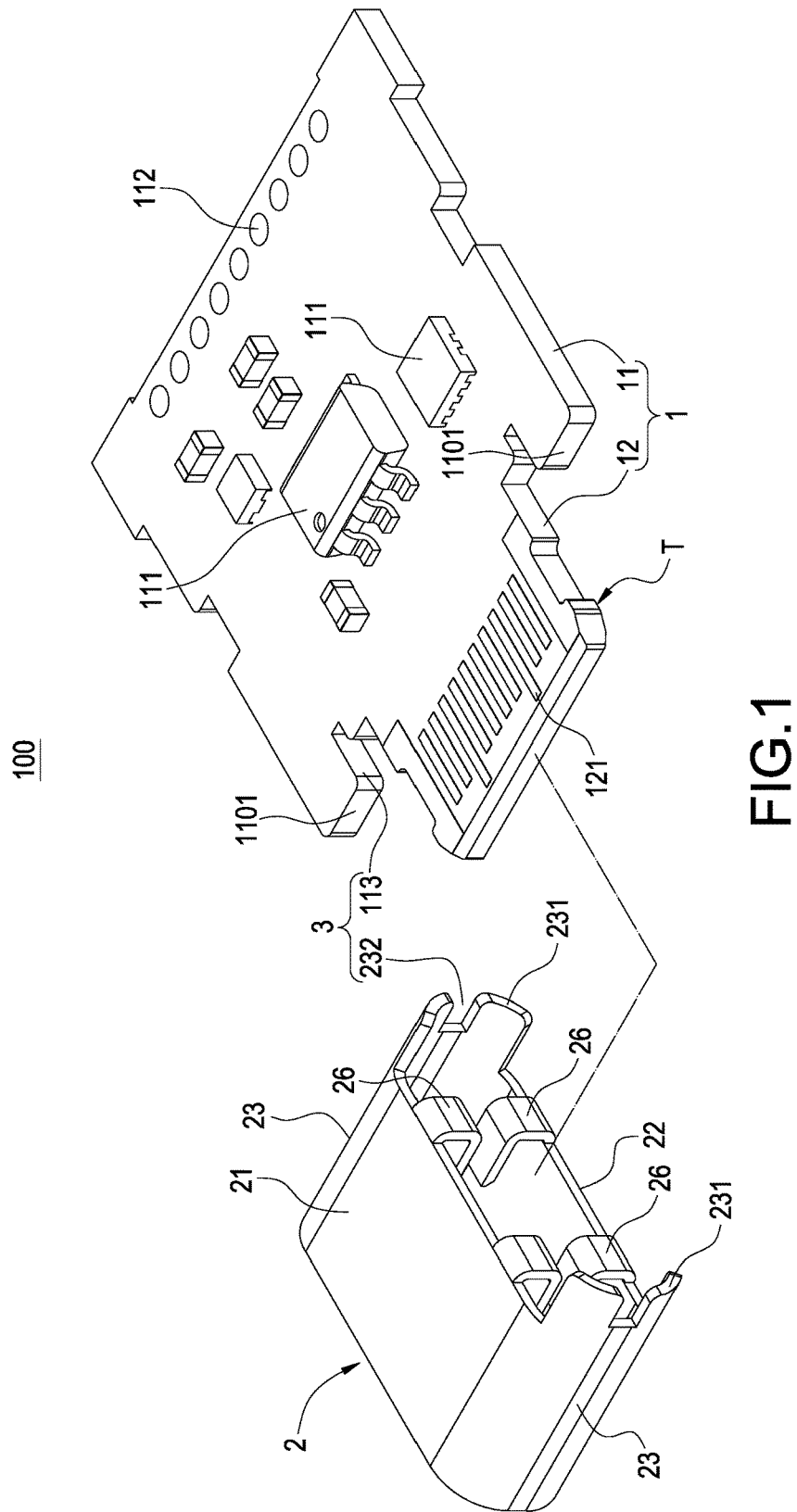
FIG. 1 is a perspective exploded view of a USB connecting apparatus according to the first exemplary embodiment of the present invention.
Figure 2:
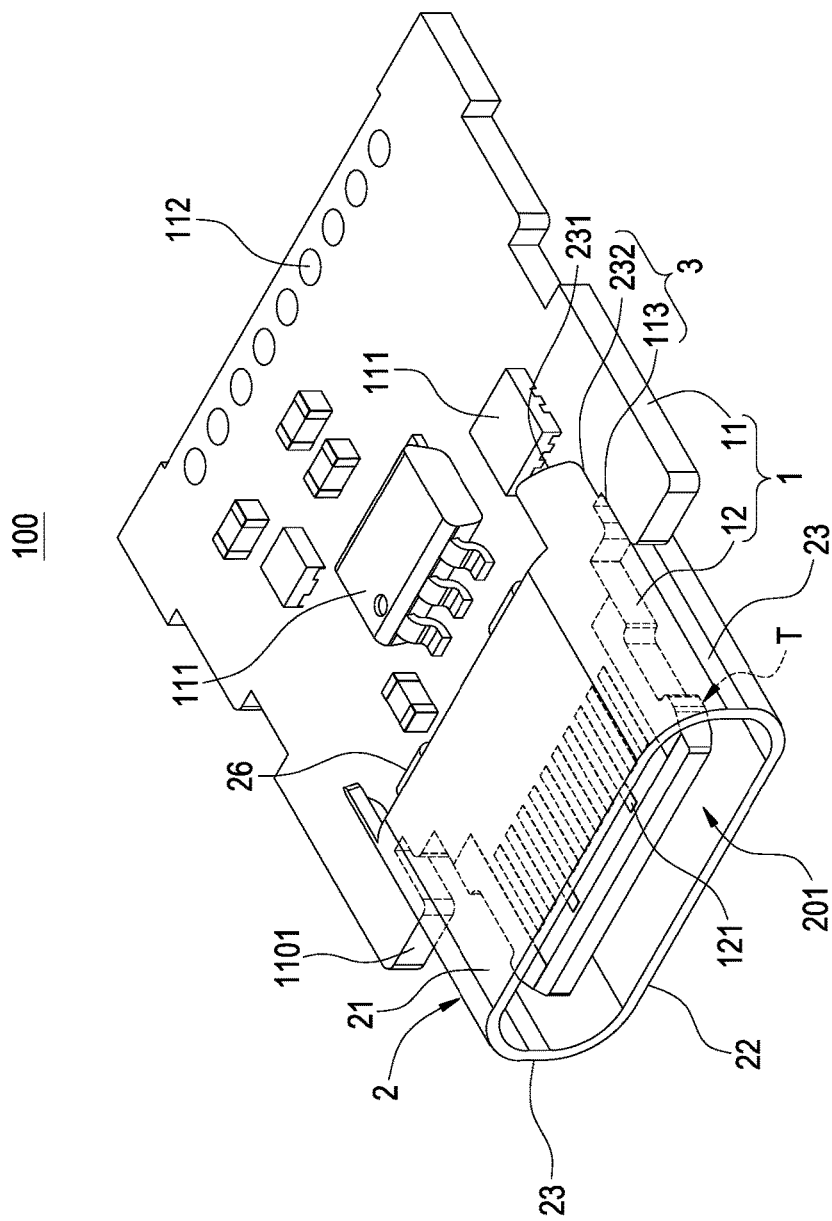
FIG. 2 is a perspective assembly view of the present invention according to FIG. 1 viewed from one viewing angle.
Figure 3:
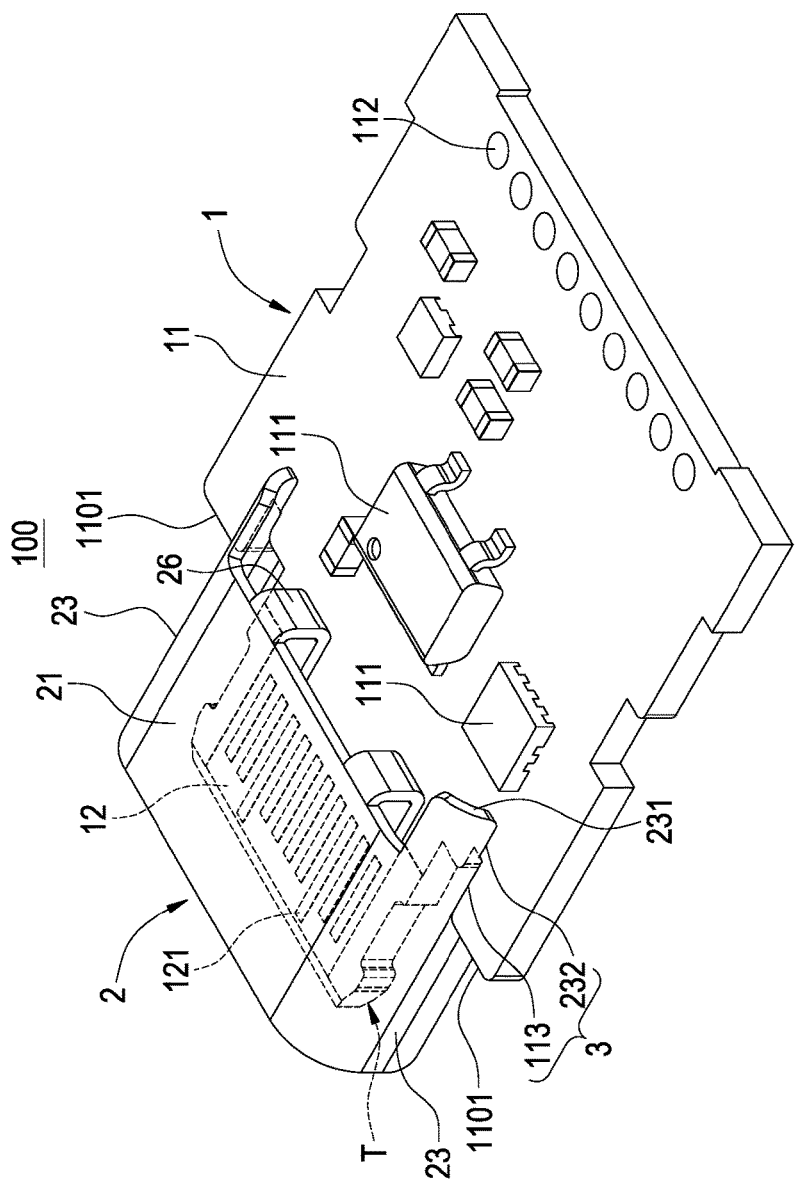
FIG. 3 is another perspective assembly view of the present invention according to FIG. 1 viewed from another viewing angle.
Figure 4:
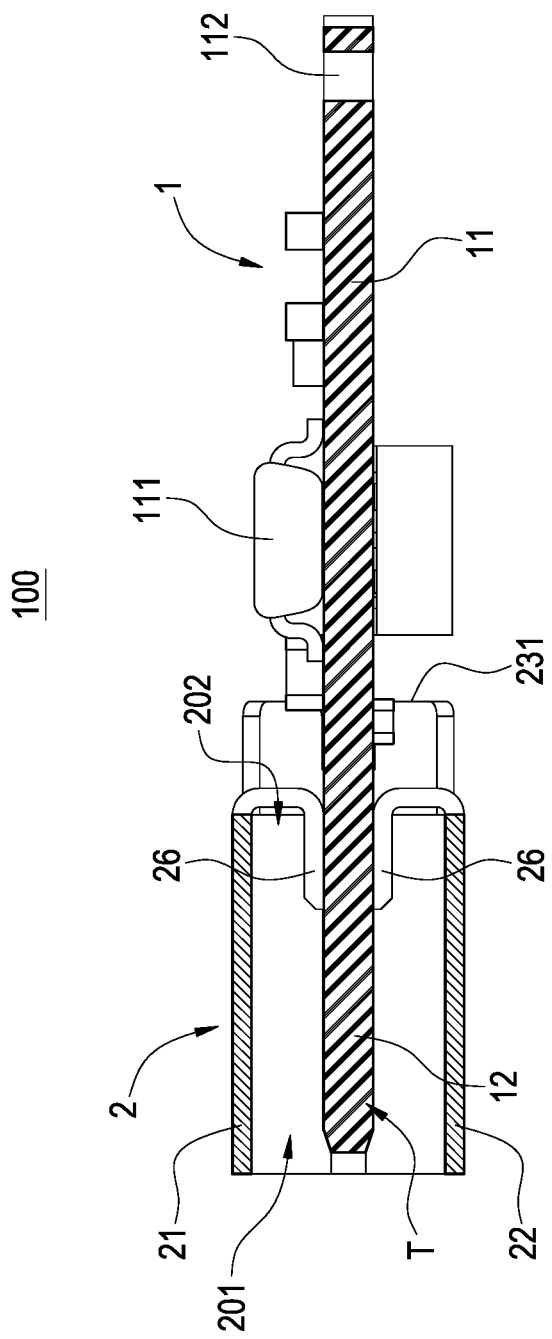
FIG. 4 is a first cross section view of a USB connecting apparatus according to the first exemplary embodiment of the present invention.
Figure 5:
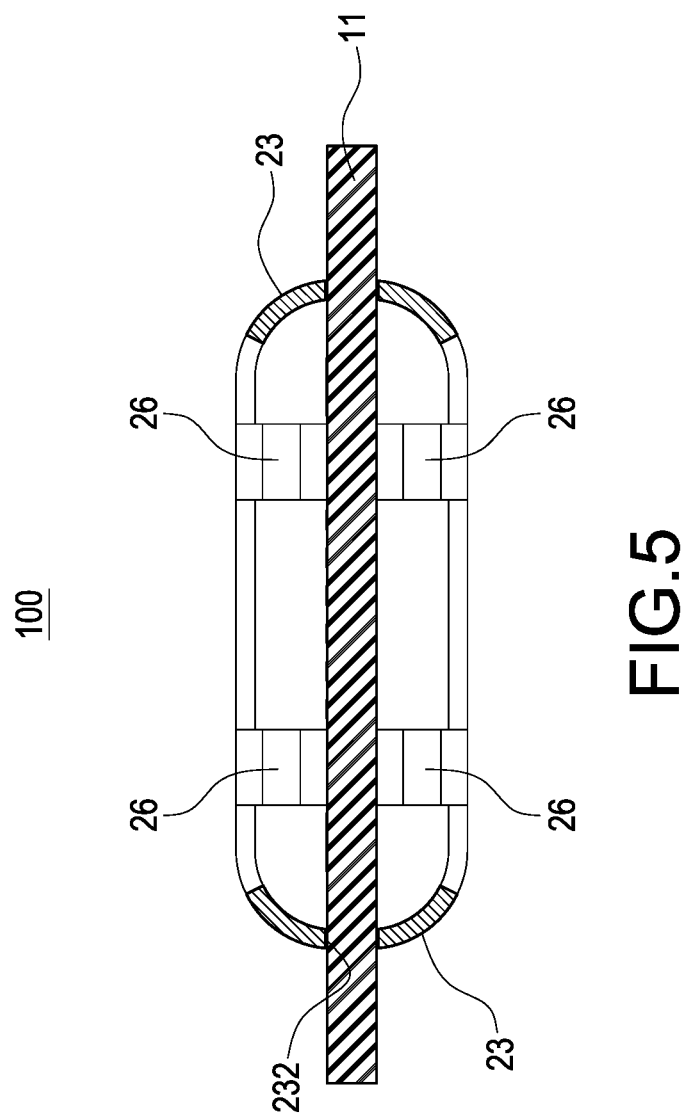
FIG. 5 is a second cross section view of a USB connecting apparatus according to the first exemplary embodiment of the present invention.

The assembly structure 3 is arranged on the board member 1 and/or the metal housing 2 (including: arranged on the board member 1, arranged on the metal housing 2 and arranged between the board member 1 and the metal housing 2) in order to allow the board member 1 and the metal housing 2 to be positioned relative to each other; in addition, the present invention is not limited to any particular type of structure and method as long as the two can be positioned relative to each other. In this exemplary embodiment, the example of the assembly structure 3 comprising a plurality of board positioning slots 113 and a plurality of housing positioning slots 232 are used for illustration, and details are provided in the following:

The main body 11 of the board member 1 includes a plurality of board positioning slots 113 formed on the front side edge 1101 toward the rear thereof. As shown in the drawings, two opposite sides of the tongue plate T are formed of a board positioning slot 113 respectively. The two lateral sides 23 of the metal housing 2 includes a plurality of housing positioning slots formed on its rear side edge 231 toward the front thereof. Accordingly, each housing positioning slot 232 corresponds to each board positioning slot 113 for insertion onto each other respectively (as shown in FIG. 2, FIG. 3 and FIG. 5) in order to be secured onto each other; therefore, the metal housing 2 and the board member 1 can be positioned relative to each other.

Furthermore, to allow the tongue plate T to be maintained at the central position of the metal housing 2 in order to facilitate the corresponding insertion of the USB Type-C male connector, the USB connecting apparatus 100 of the present invention further includes a plurality of supporting members 26 formed at the metal housing 2 accordingly, and the details are as described in the following:

The top surface 21 and the bottom surface 22 of the metal housing 2 respectively include at least one supporting member 26 protruded or extended therefrom and opposite from each other. In this exemplary embodiment, each supporting member 26 is formed to extend from the rear side edge of the top surface 21 and the rear side edge of the bottom surface 22 rearward respectively, followed by bending toward the front. Certainly, the supporting member 26 can also be formed to extend from the rear side edge of the front surface 21 and the rear side edge of the bottom surface 22 downward respectively, followed by bending toward the front. In addition, regardless of the type of extension and the type of bending method, each supporting member 26 extends corresponding to the location of the aforementioned opening 202 and toward the aforementioned two surfaces of the tongue plate T respectively. According to such configuration, each supporting member 26 is able to respectively abut against the two surfaces of the tongue plate T facing toward each other (see FIG. 4); consequently, the tongue plate T can be firmly and precisely maintained at the central position of the metal housing 2 in order to achieve the position limitation effect.

Figure 6:
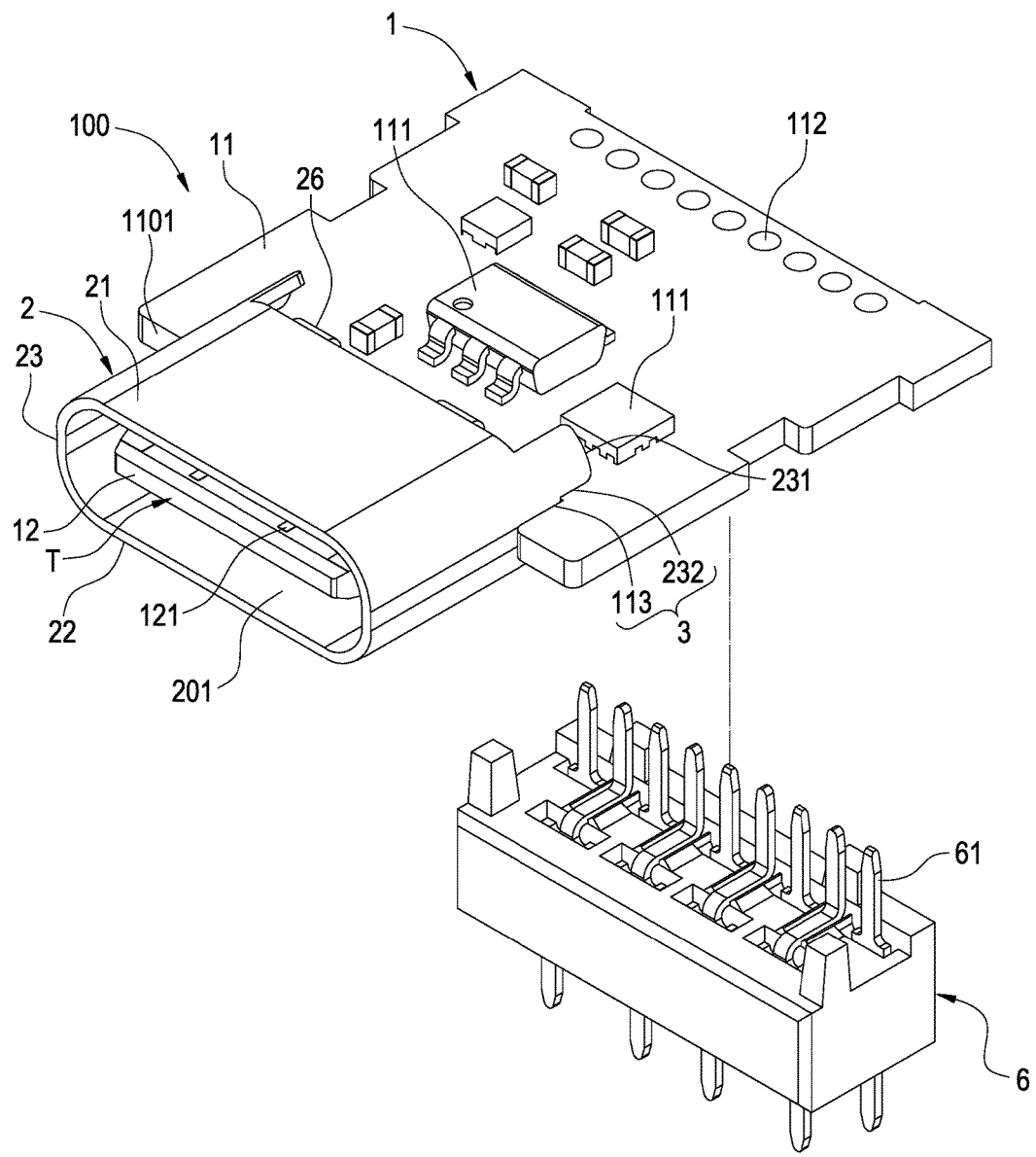
FIG. 6 is a perspective exploded view of a USB connecting apparatus according to the first exemplary embodiment of the present invention further comprising an adapter structure.

According to the above regardless the type of the electrical connection portion 7 of the aforementioned electronic product circuit board 700, as long as the USB connecting apparatus 100 of the present invention includes the second conductive connection portions 112 having a corresponding quantity and corresponding pins, along with the electronic unit 111 for conversion, the USB connecting apparatus of the present invention can be used as USB Type-C directly after electrically connecting the second conductive connection portions 112 to the electrical connection portion 7 without making any modifications on the electronic product circuit board 700. For example, if the electrical connection portion 7 is a connection portion of HDMI form or DP (Display Port) form, as long as the second conductive connection portions 112 of the USB connecting apparatus 100 are pre-manufactured to have the corresponding quantity and corresponding pins and under the conversion effect of the electronic unit 111, the aforementioned electronic product circuit board 700 can then utilize the USB connecting apparatus 100 of the present invention to have a female connector of USB Type-C. Certainly, if the pins are not matching with each other, an adapter structure 6 can also be used for adaptive connection, and details thereof are as described in the following:

As shown in FIG. 6 and FIG. 7, the adapter structure 6 includes a plurality connection terminals 61 inserted thereon. One end of the connection terminal 61 is designed to match with the second conductive connection portions 112 of the USB connecting apparatus of the present invention, and another end of the connecting terminals 61 is designed to match with the electrical connection portion 7 of the aforementioned electronic product circuit board 700. Accordingly, the one end and another end of the connection terminals 61 of the adapter structure can be connected to the second conductive connection portion 112 and the electrical connection portion 7 respectively; therefore, the purpose of adaptive connection can be achieved.

Figure 8:
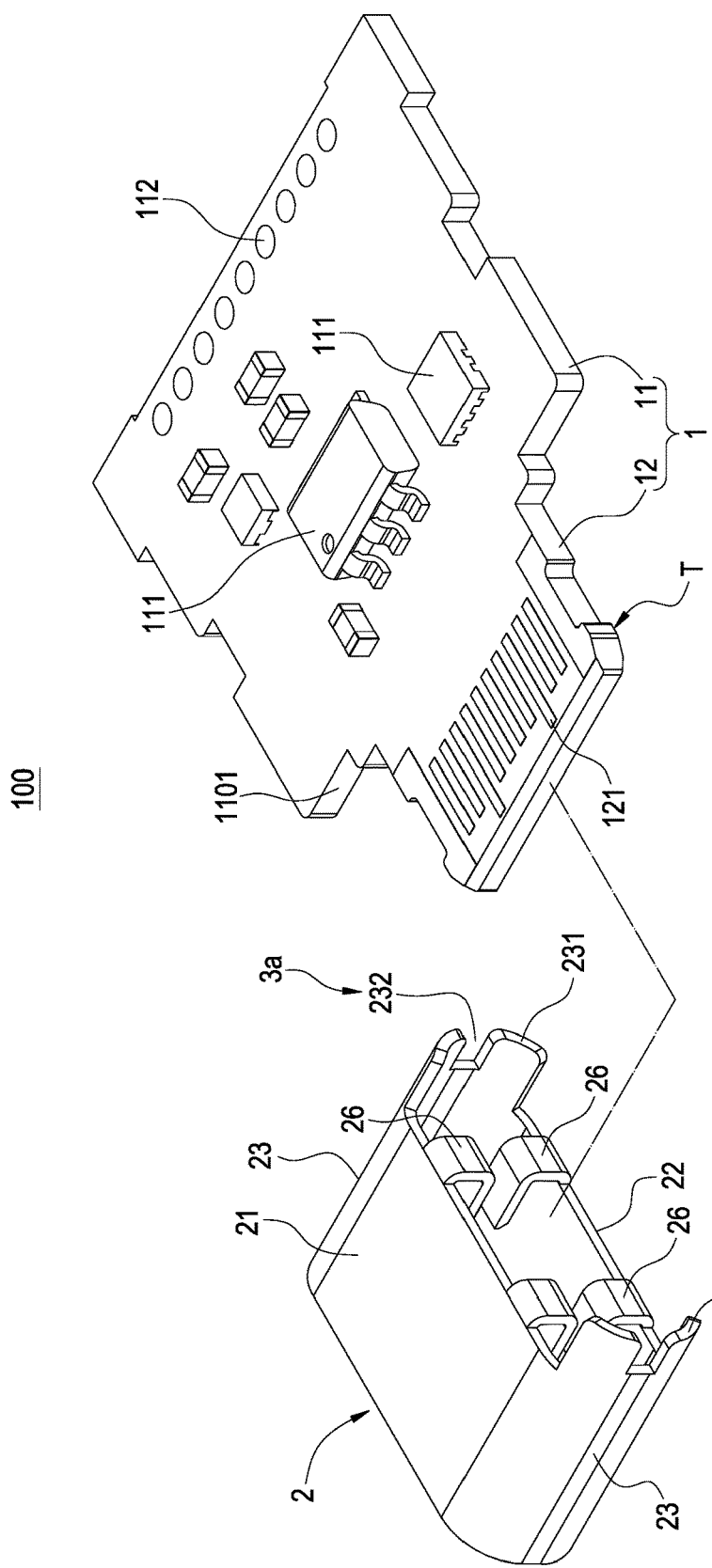
FIG. 8 is a perspective view of a USB connecting apparatus according to the second exemplary embodiment of the present invention.

FIG. 8 shows a second exemplary embodiment of the USB connecting apparatus 100 of the present invention. The second exemplary embodiment is generally identical with the aforementioned first exemplary embodiment, and the difference relies only in the assembly structure 3a.

As shown in the drawing, the assembly structure 3a in this exemplary embodiment comprises a plurality of housing positioning slots 232 formed on the metal housing 2. In addition, the structure of the housing positioning slot 232 in this exemplary embodiment is identical the structure of the housing positioning slot 232 in the first exemplary embodiment. In addition, the front side edge 1101 of the main body portion 11 is not formed of any positioning slots.

The front side edge 1101 of the main body portion 11 is arranged to correspond with each housing positioning slot 232 for insertion thereon in order to be secured onto each other; therefore, the metal housing 2 and the board member 1 can be positioned relative to each other.

Figure 9:
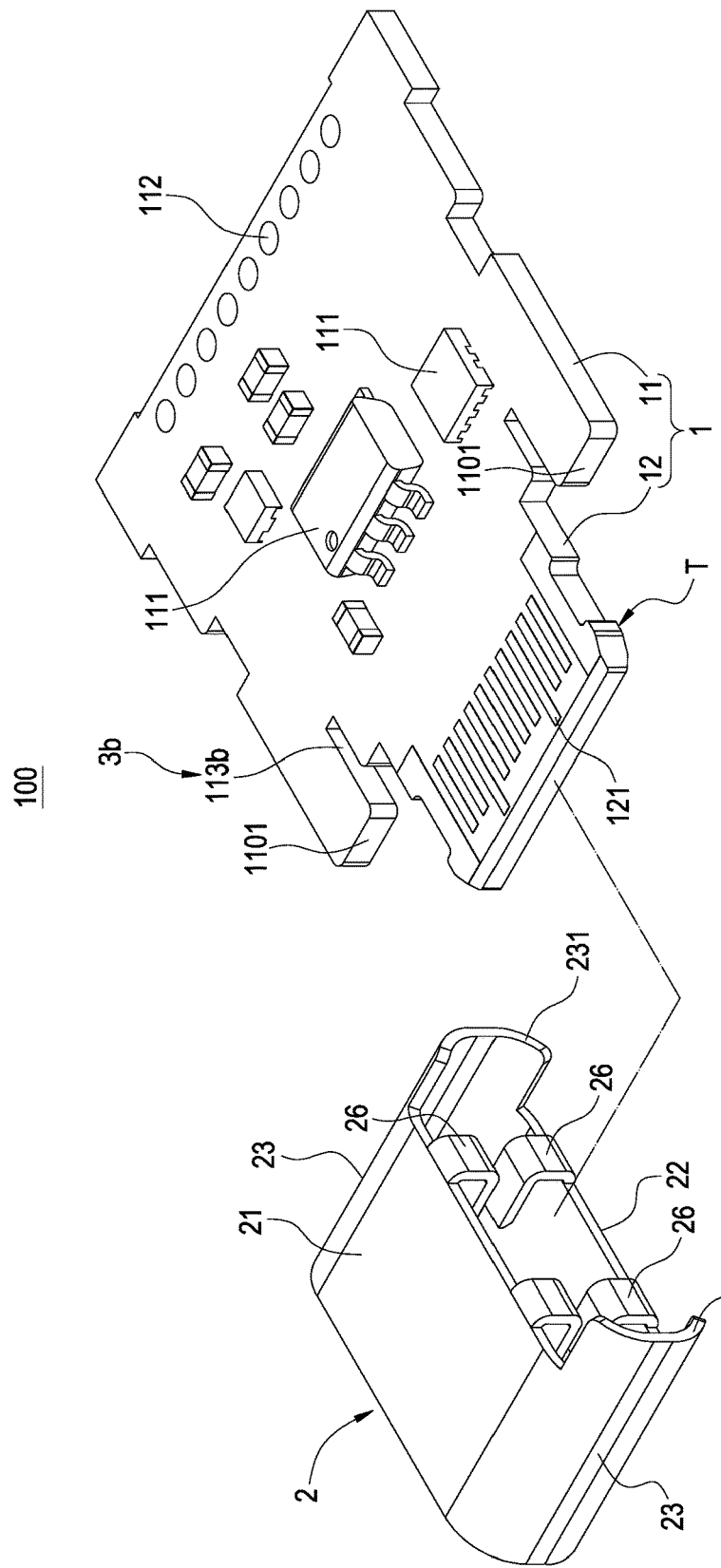
FIG. 9 is a perspective view of a USB connecting apparatus according to the third exemplary embodiment of the present invention.

FIG. 9 shows a third exemplary embodiment of the USB connecting apparatus 100 of the present invention. The third exemplary embodiment is generally identical with the aforementioned first exemplary embodiment, and the difference relies only in the assembly structure 3b.

As shown in the drawing, the assembly structure 3b in this exemplary embodiment comprises a plurality of board positioning slots 113b formed on front side edge 1101 of the main body portion 11. In addition, the structure of the board positioning slot 113b in this exemplary embodiment is identical the structure of the board positioning slot 113 in the first exemplary embodiment; nevertheless, the length of the positioning slot is longer than the one in the first exemplary embodiment since the rear side edge 231 of the metal housing 2 in this exemplary embodiment is not formed of any positioning slots.

The rear side edges 231 of the two lateral sides 23 are arranged to correspond with each board positioning slot 113b for insertion thereon in order to be secured onto each other; therefore, the metal housing 2 and the board member 1 can be positioned relative to each other.

Figure 10:
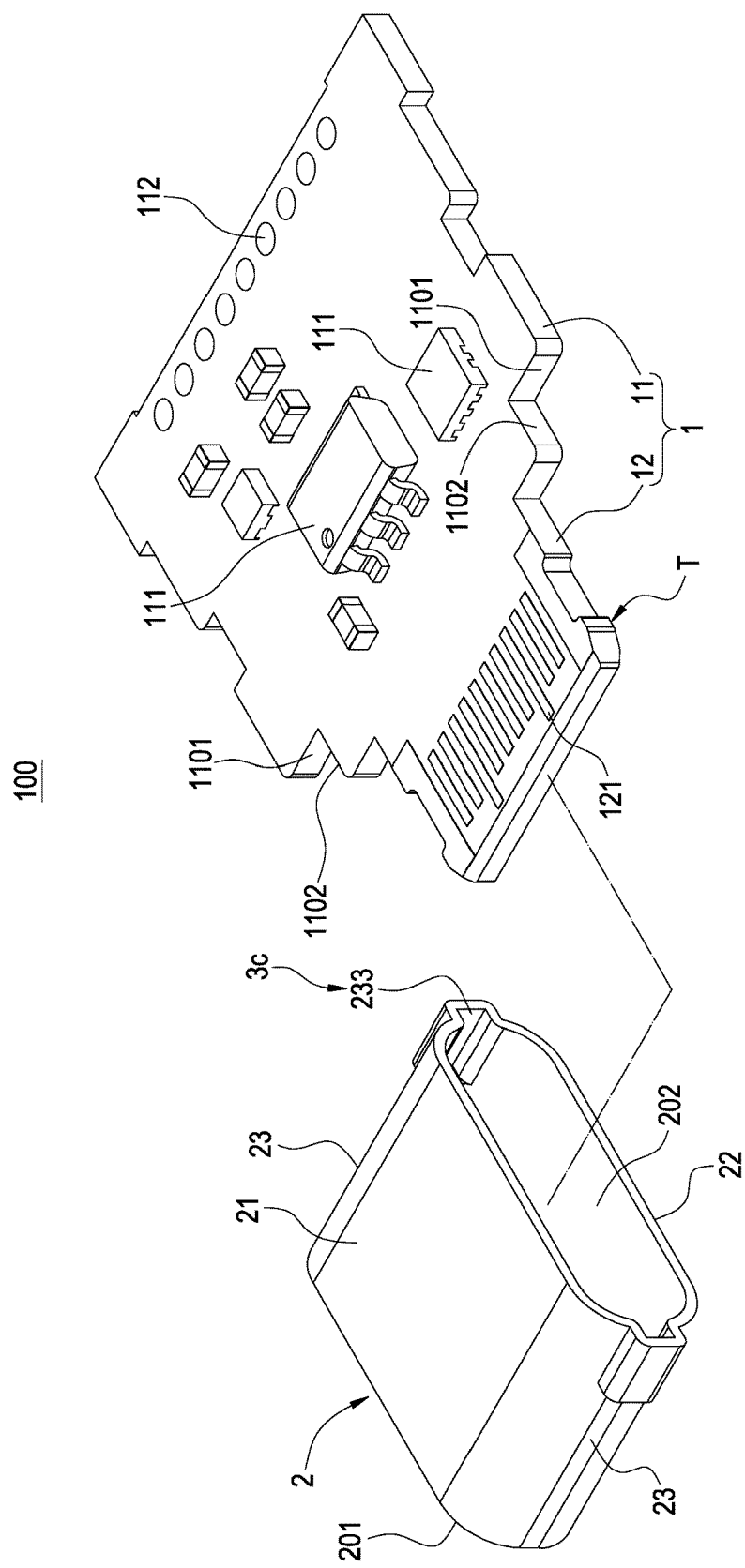
FIG. 10 is a perspective view of a USB connecting apparatus according to the fourth exemplary embodiment of the present invention.
Figure 11:
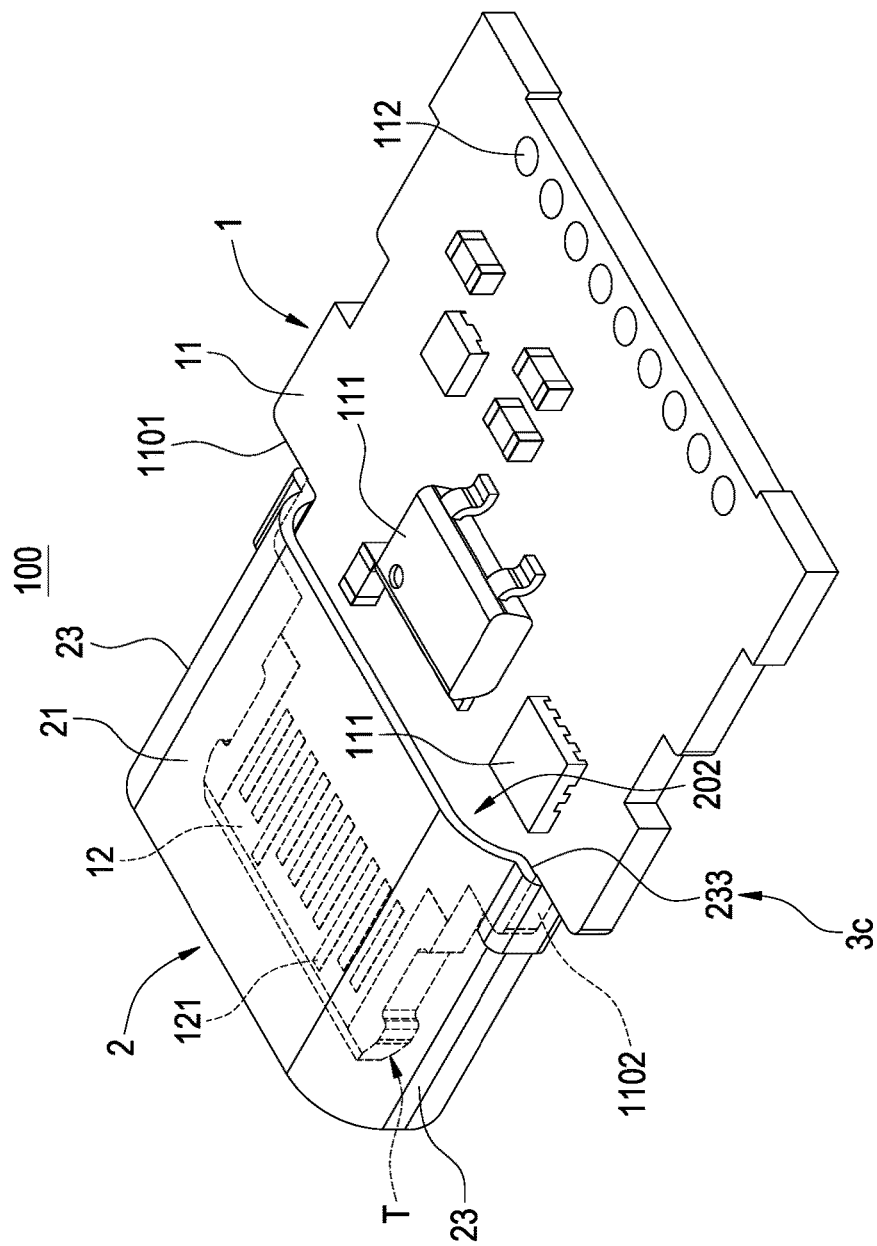
FIG. 11 is a perspective assembly view of the present invention according to FIG. 10.

FIG. 10 and FIG. 11 show a fourth exemplary embodiment of the USB connecting apparatus 100 of the present invention. The fourth exemplary embodiment is generally identical with the aforementioned first exemplary embodiment, and the difference relies only in the assembly structure 3c.

As shown in the drawing, the assembly structure 3c in this exemplary embodiment comprises a plurality of limitation guiding slots 223 arranged at the inner wall of the two lateral sides 23 of the metal housing. The limitation guiding slots 233 extend from the rear end of the metal housing 2 toward the front end direction by a small section of distance. In addition, the limitation guiding slots 233 are formed at the posterior section location (referring to the horizontal direction) of the lateral side 23 adjacent to the opening 202. Furthermore, the main body portion 11 is formed of two lateral side edges 1102 corresponding to the limitation guiding slots 233.

The two lateral side edges 1102 of the main body portion 11 are arranged to slidably connect with the two limitation guiding slots 233 correspondingly and to press onto each other in order to allow the metal housing 2 and the board member 1 to be positioned relative to each other. In addition, the limitation guiding slots 233 are arranged at the central position (referring to the vertical direction) of the lateral side 23 in order to achieve the effect of limiting the board member 1 at the central position of the metal housing 2.

In this exemplary embodiment, since the two lateral side edges 1101 of the main body portion 11 is slidably connected with the two limitation guiding slots 233 of the metal housing 2 correspondingly, the tongue plate T is already secured firmly at the central position of the metal housing 2, and the aforementioned supporting members 26 (see FIG. 10 and FIG. 11) can still be omitted in an actual application. Certainly, the supporting members 26 can also be formed on the metal housing 2, and the present invention is not limited to such configuration only.

In view of the above, in comparison to the prior arts, the present invention is capable of achieving the following technical effects: it can be used in an existing electronic product circuit board 700 and can be used as USB Type-C direction. In other words, by connecting the USB connecting apparatus 100 of the present invention to the original electrical connection portion 7 of an existing electronic product circuit board 700, it can have a USB Type-C available for use, which is simple and convenient, and the significant cost of redesign of circuit board can be saved.

The above describes the preferable and feasible exemplary embodiments of the present invention for illustrative purposes only, which shall not be treated as limitations of the scope of the present invention. Any equivalent changes and modifications made in accordance with the scope of the claims of the present invention shall be considered to be within the scope of the claim of the present invention.

What is claimed is:

1. A USB connecting apparatus, comprising:
   a board member configured to be a printed circuit board complying with a female USB Type-C specification and comprising a main body portion and a tongue portion; the tongue portion having two surfaces facing away from each other;
   a plurality of first conductive connection portions electrically disposed on the two surfaces of the tongue portion in order to form a tongue plate;
   a metal housing arranged on the board member and surrounding the tongue plate correspondingly, wherein the metal housing includes a top surface, a bottom surface, an insertion port, and an opening facing toward the insertion port; each of the top surface and the bottom surface includes at least one supporting plate bending inside the metal housing towards the insertion port; and
   an assembly structure arranged on the plate member and/or the metal housing; the plate member and the metal housing configured to be positioned relative to each other via the assembly structure.

2. The USB connecting apparatus according to claim 1, wherein the assembly structure comprises a plurality of board positioning slots and a plurality of housing positioning slots; the board member includes a plurality of board positioning slots formed thereon, and the metal housing includes a plurality of housing positioning slots formed thereon; each one of the plurality of housing positioning slots of the metal housing corresponds to each one of the plurality of board positioning slots of the board member in order to be inserted thereon respectively and positioned with each other.

3. The USB connecting apparatus according to claim 1, wherein the assembly structure comprises a plurality of housing positioning slots formed on the metal housing; one side edge of the board member corresponds to the plurality of the housing positioning slots of the metal housing for insertion thereon in order to be positioned with each other.

4. The USB connecting apparatus according to claim 1, wherein the assembly structure comprises a plurality of board positioning slots formed on the board member; a plurality of side edges of the metal housing respectively correspond to the plurality of board positioning slots for insertion thereon in order to be positioned with each other.

5. The USB connecting apparatus according to claim 1, wherein the assembly structure comprises a plurality of limitation guiding slots, and the metal housing includes sides facing toward each other; the inner walls of the two sides include the limitation guiding lots arranged thereon respectively; two side edges of the board member slidably attached onto the two limitation guiding slots of the metal housing correspondingly in order to be positioned thereon respectively.

6. The USB connecting apparatus according to claim 5, wherein the plurality of limitation guiding slots are formed on the metal housing adjacent to a posterior section.

7. The USB connecting apparatus according to claim 5, wherein each one of the limitation guiding slots is positioned between upper and lower portions of the side of the metal housing.

8. The USB connecting apparatus according to claim 1, wherein the plurality of supporting plates respectively abut against two surfaces of the tongue plate facing away from each other.

9. The USB connecting apparatus according to claim 8, wherein the plurality of supporting plates extend toward the two surfaces of the tongue plate corresponding to a location of the opening respectively in order to abut against thereon.

10. The USB connecting apparatus according to claim 1, wherein the main body portion of the board member is electrically disposed of at least one electronic unit.

11. The USB connecting apparatus according to claim 1, wherein each one of the first conductive connection portions is a gold finger.

12. The USB connecting apparatus according to claim 1, wherein a quantity of the plurality of the first conductive connection portions is 4-24 units complying with the USB Type-C specification.

13. The USB connecting apparatus according to claim 1, wherein the USB connecting apparatus is an electronic product circuit board further comprising a plurality of second conductive connection portions; the electronic product circuit board includes an electrical connection portion; the plurality of second conductive connection portions are electrically disposed on the main body portion and are electrically connected to the electrical connection portion.

14. The USB connecting apparatus according to claim 13, further comprising an adapter structure electrically connected between the plurality of second conductive connection portions and the electrical connection portion.

15. The USB connecting apparatus according to claim 1, wherein the assembly structure is arranged on the board member or the metal housing; the board member and the metal housing are positioned with each other via the assembly structure; the metal housing further includes two supporting plates, and the two supporting plates abut against two surfaces of the tongue plate facing toward each other respectively.

* * * * *